United States Patent [19]
McClure

[11] Patent Number: 5,572,456
[45] Date of Patent: Nov. 5, 1996

[54] DISTRIBUTED NOR TAG MATCH APPARATUS

[75] Inventor: David C. McClure, Carrollton, Tex.

[73] Assignee: SGS-Thomson Microelectronics, Inc., Carrollton, Tex.

[21] Appl. No.: 114,747

[22] Filed: Aug. 31, 1993

[51] Int. Cl.⁶ .................................................. G11C 15/04
[52] U.S. Cl. ................. 365/49; 365/189.07; 365/189.11; 395/427
[58] Field of Search ................................ 365/49, 189.07, 365/189.11; 395/425

[56] References Cited

U.S. PATENT DOCUMENTS

| | | | |
|---|---|---|---|
| 5,031,141 | 7/1991 | Guddat et al. | 365/49 |
| 5,146,428 | 9/1992 | Tanimura | 365/189.08 |
| 5,218,567 | 6/1993 | Suzuki et al. | 365/49 |
| 5,319,348 | 6/1994 | Lee et al. | 326/52 X |

*Primary Examiner*—Son T. Dinh
*Attorney, Agent, or Firm*—Theodore E. Galanthay; Kenneth C. Hill; Lisa K. Jorgenson

[57] ABSTRACT

A system for providing a CMOS NOR function that is distributed across a number of devices located on different chips. Specifically the present invention may be implemented in tag RAMs to provide expanded addressing. In other words, larger addresses may be processed using the present invention. This function is provided by using some transistors on each chip as part of the CMOS NOR gate. The tag RAM includes: a first input for receiving a first portion of an address, a second input for receiving a second portion of the address; a memory array connected to the first input; a comparator connected to the memory array and the second input, wherein the comparator has an output that produces an output signal in response to receiving a first signal from the second input and a second signal from the memory array; a first transistor having a gate connected to the output of the comparator, a first source/drain connected to a first pin, and a second source/drain connected to a second pin; and a second transistor having a gate connected to the output of the comparator, a first source/drain connected to the output pin, a second source/drain connected to a lower power supply voltage source.

23 Claims, 3 Drawing Sheets

DISTRIBUTED NOR TAG MATCH APPARATUS

BACKGROUND OF THE INVENTION

1. Field of the Invention

The present invention relates in general to digital computer systems, and more particularly to cache memory systems.

2. Description of the Prior Art

Cache memories are used in many computer systems to improve system performance. A cache memory is a relatively small, fast memory which resides between a central processor and main system memory. Whenever the processor reads the contents of a memory location which is stored in the cache memory, the time required to access such a location is drastically reduced. A good cache technique can provide a "hit ratio" of well over ninety percent, meaning that no main memory access is necessary for over ninety percent of the read operations performed. Access of data which is stored in the cache can improve access times by factors of three to ten times.

A cache performs functions requiring two different types of memory. The first type is the data memory, in which the data is actually stored. The second type is known as a tag memory, or tag RAM, which is used to determine which memory locations are actually stored in the cache. In general, the cache tag RAM contains a plurality of entries corresponding to the entries of the data cache. Each entry is indexed by some number of least significant bits of the address generated by the central processor, with the tag entry itself containing the most significant bits of the memory location which is stored in the corresponding data cache entry. If the most significant bits stored in the cache tag match the most significant bits of the address currently being generated, with the least significant bits of this address acting as an index to the tag RAM, a cache "hit" has occurred and the data to be read may be taken from the corresponding data cache entry. If data corresponding to the desired address is not located in the data cache, the tag entry will not match the most significant bits of the address, and a "miss" occurs. This indicates that the data must be retrieved from main system memory and placed into the data cache. At this time, the current contents of the cache tag entry are overwritten with the most significant bits of the newly retrieved address.

Cache tag RAMs are typically wired-NOR'ed together to increase the effective width of the resulting cache tag RAM. As a result, the address space of the cache tag RAM may be expanded.

FIG. 1 illustrates an example of two tag RAMs wired together in a wired-NOR configuration. Tag RAM 2 has a number of input pins 4 for least significant bits of an address and a number of input pins 6 for the most significant bits of an address. Depending on the signals sent to input pins 4 and 6, tag RAM 2 may change output at output pin 8 in response to the input. Similarly, tag RAM 10 includes input pins 4 and 6 and output pin 8. Output pin 8 of tag RAM 2 controls the gate of transistor Q1 while output 8 of tag Ram 10 controls the gate of transistor Q2. These two transistors control the output at output pin, MATCH. A resistor R has one end connected to the source/drains of transistors Q1 and Q2 and has another end connected to power supply voltage VCC. Additionally, transistors Q1 and Q2 have their source/drains connected to the bus capacitance C, which is also connected to power supply voltage VSS. Typically, power supply voltage VCC is at a higher voltage than power supply voltage VSS.

This match bus configuration is well known in the prior art. The performance of the pull-up resistor R in pulling output pin MATCH high is not as fast as desired because of the RC time constant. Resistor R also can cause an increase in pull-down time because the open drain transistors must overcome resistor R to pull down the signal at output MATCH. If resistor R is large, pull-down time is decreased, but pull-up time is increased.

It would be desirable to improve the output transition time of the output at output pin MATCH or any other wired-NOR type of signal. Therefore, it would be desirable to have a method and apparatus for reducing the effects of RC time constants on pull-up and pull-down time of an output to a wired-NOR system.

SUMMARY OF THE INVENTION

The present invention provides a system for providing a CMOS NOR function that is distributed across a number of devices located on different chips. Specifically the present invention may be implemented in tag RAMs to provide expanded addressing. In other words, larger addresses may be processed using the present invention. This function is provided by using some transistors on each chip as part of the CMOS NOR gate. The tag RAM includes: a first input for receiving a first portion of an address, a second input for receiving a second portion of the address; a memory array connected to the first input; a comparator connected to the memory array and the second input, wherein the comparator has an output that produces an output signal in response to receiving a first signal from the second input and a second signal from the memory array; a first transistor having a gate connected to the output of the comparator, a first source/drain connected to a first pin, and a second source/drain connected to a second pin; and a second transistor having a gate connected to the output of the comparator, a first source/drain connected to the output pin, a second source/drain connected to a lower power supply voltage source.

Two or more of these tag RAMs may be connected together to form a distributed tag RAM, providing more address space. The first pin of the first tag RAM is connected an upper power supply voltage. The second pin of each tag RAM, other than the last, tag RAM is connected to the first pin of a subsequent tag RAM in the set. The output pin of each tag RAM is connected to the match pin, which provides an output indicating whether a match in the tag has occurred. The second pin of the last tag RAM is connected to the match pin, wherein a NOR function is provided between output pins of the tag RAMs.

The first transistor may be a p-channel transistor and the second transistor may be an n-channel transistor, forming a CMOS NOR function when tag RAMs of the present invention are connected together.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

Figure 1:
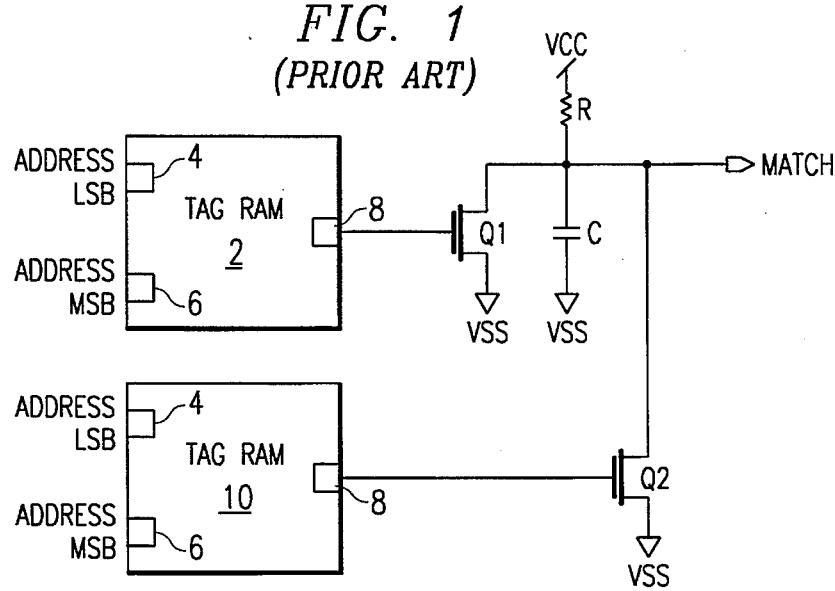
FIG. 1 illustrates two tag RAMs configured in a wired-NOR configuration known in the prior art.
Figure 2:
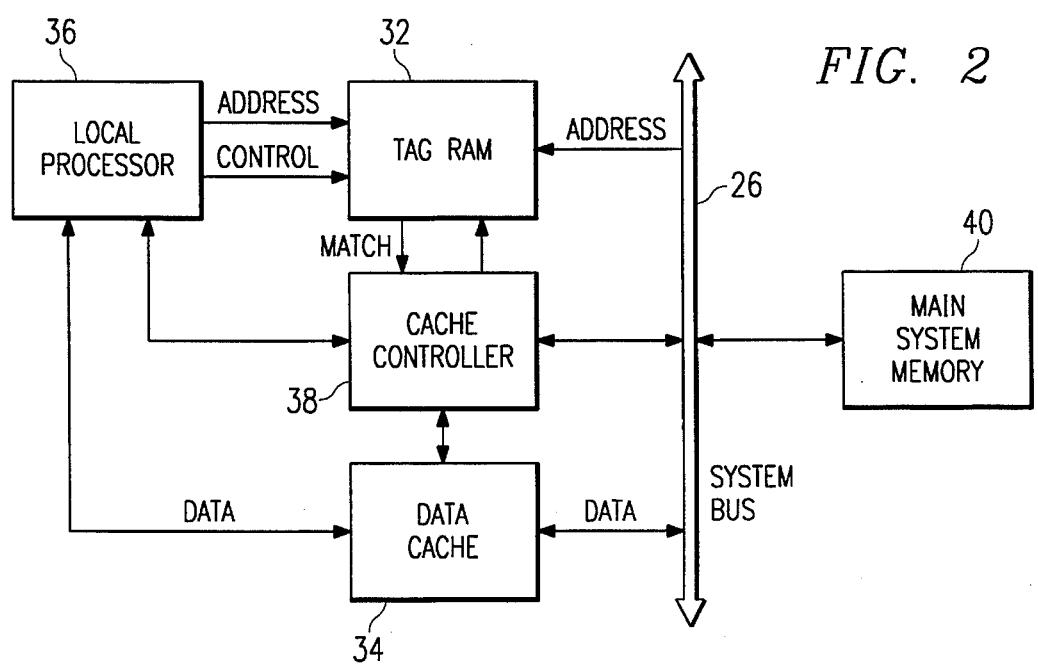
FIG. 2 is a high-level block diagram showing a cache memory system utilizing a cache tag memory.

With reference now to the figures and in particular with reference to FIG. 2, a high level block diagram showing a cache memory system utilizing a cache tag memory is illustrated. A cache tag RAM 32 and a data cache 34 communicate with system bus 26 and processor 36. Cache controller 38 performs the usual cache control functions found in caches which are suitable for use with single or multiple processor systems.

Data cache 34 exchanges data with the processor 36 and system bus 26 under the control of cache controller 38. Various control signals are exchanged by the processor 36 and cache controller 38, and between the cache controller 38 and the system bus 26. Address and control signals are communicated from processor 36 to cache tag RAM 32. Address and control signals are also communicated between cache tag RAM 32 and system bus 26.

Cache tag RAM 32 also passes a signal indicating whether a match is present to cache controller 38. A signal indicating a match means that the memory location currently being addressed by processor 36 resides in the data cache 34, and that the entry is currently valid. Cache controller 38 then causes the location being accessed by local processor 36 to be read directly from data cache 34. If the signal from cache tag RAM 32 indicates a miss, cache controller 38 causes the requested address to be loaded into the data cache 34 and cache tag RAM 32 prior to completing the local processor memory request.

As known in the art, cache tag RAM 32 is used to determine which memory locations are actually stored in data cache 34. In general, cache tag RAM 32 contains a plurality of entries corresponding to the entries of data cache 34. Each entry is indexed by some number of least significant bits of the address generated by a central processor, with the tag entry itself containing the most significant bits of the address of the memory location which is stored in the corresponding data cache entry. If the most significant bits stored in tag RAM 32 match the most significant bits of the address currently being generated, with the least significant bits of this address acting as an index to the tag RAM 32, a cache "hit" has occurred and the data to be read may be taken from the corresponding data cache entry. If data corresponding to the desired address is not located in data cache 34, the tag entry will not match the most significant bits of the address, and a "miss" occurs. This indicates that the data must be retrieved from main system memory 40 and placed into data cache 34. At this time, the current contents of the cache tag entry are overwritten with the most significant bits of the newly retrieved address, and the corresponding data cache entry is overwritten with a new data cache entry.

Figure 3:
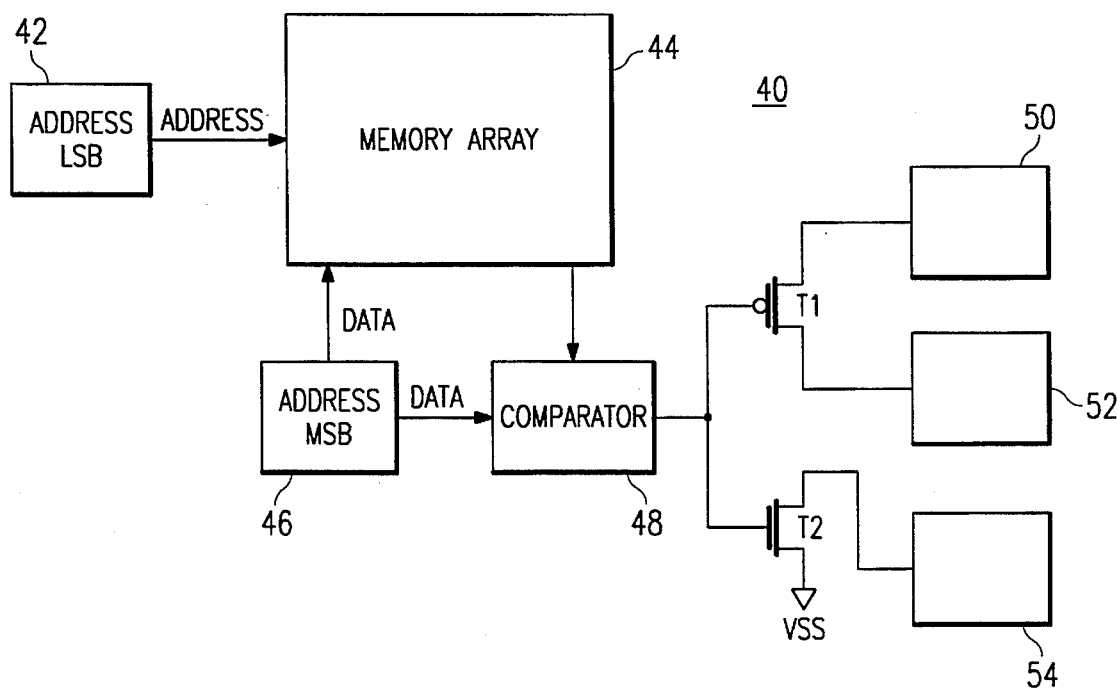
FIG. 3 is a block diagram of a tag RAM that may be used with the cache memory system illustrated in FIG. 2.

Next, FIG. 3 is a block diagram of a tag RAM that may be used in accordance with a preferred embodiment of the present invention within the cache memory system illustrated in FIG. 2. Cache tag RAM 40 has multiple input pins 42 connected to memory array 44. Input pins 42 receives the least significant bits (LSBs) of an address. Input pins 46, connected to comparator 48, receive the most significant bits (MSBs) of an address. The MSBs include data provided to the tag RAM during writes. The output from memory array 44 is compared with the input at input pins 46 at comparator 48. The output from comparator 48 controls the gates of transistors T1 and T2.

Figure 4:
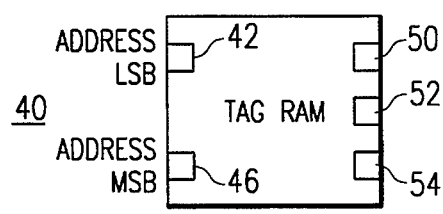
FIG. 4 depicts a diagram of the tag RAM in FIG. 3.

Transistor T1 is a p-channel field effect device (FET), while transistor T2 is an n-channel FET. Transistor T1 also may be a n-channel FET. Transistor T1 has a source/drain connected to additional pin 50 and a second source/drain connected to additional pin 52. Transistor T2 has a source/drain connected to output pin 54 and a source drain connected to power supply voltage VSS. If a match occurs, the output at comparator 48 is a logic 0, which turns off transistor T2, resulting in a high signal or a logic 1 at output pin 54 by virtue of the pull-up transistor T1. Transistor T1 is turned on by a low signal from comparator 48 allowing current to flow from additional pin 50 to additional pin 52. FIG. 4 depicts a diagram of tag RAM 40 illustrating the pin outs of the tag RAM.

Figure 5A:
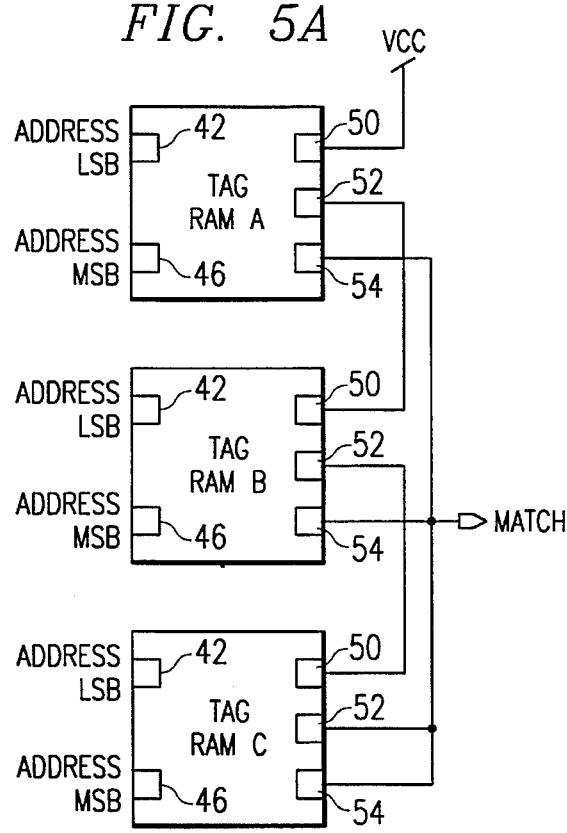
FIG. 5A is a block diagram of pin connections between three tag RAMs.

Referring now to FIG. 5A, a block diagram of pin connections between three tag RAMs is illustrated, forming a distributed tag RAM. Additional pin 50 of tag RAM A is connected to power supply voltage VCC. Additional pin 52 of tag RAM A is connected to additional pin 50 of tag RAM B; additional pin 52 of tag RAM B is connected to additional pin 50 of tag RAM C. Output pin 54 in tag RAMs A, B, and C are all connected together. Additional pin 52 in tag RAM C also is connected to output pin 54 in tag RAMs A, B, and C. The connections of output pins 54 in tag RAMs A, B, and C and pad 52 in tag RAM C are connected to an output, MATCH. The resulting connections of these three tag RAMs form a full complementary metal-oxide (CMOS) NOR, replacing the wired-NOR configuration presently used. Consequently, the problems connected with the pull-up resistor and its associated RC time constant and current drain are avoided.

Figure 5B:
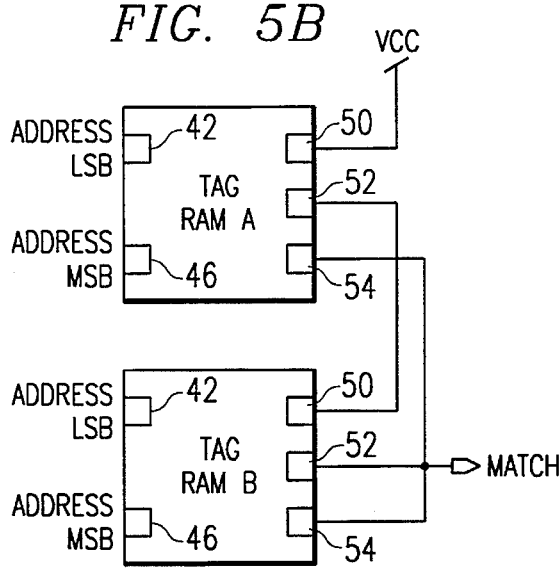
FIG. 5B is a block diagram of pin connections between two tag RAMs according to the present invention.

FIG. 5B is a block diagram of pin connections between two tag RAMs according to the present invention. Pin 50 of tag RAM A is connected to upper power supply voltage VCC while pin 52 of tag RAM A is connected to pin 50 of tag RAM B. Pin 54 of tag RAM A and B are connected to an output, MATCH. Pin 52 of tag RAM B is connected to MATCH. Thus, a distributed tag RAM may be created with tag RAMs A and B.

More tag RAMs may be connected together in the configuration shown in FIGS. 5A and 5B. Each tag RAM connected together has pin 52 connected to pin 50 of a subsequent tag RAM. The exception to these connections applies to the first tag RAM of the series, which has pin 50 connected to power supply VCC. Another exception is the last tag RAM in the series; pin 52 of the last tag RAM is not connected to pin 50 of a previous tag RAM. Instead, pin 52 is connected to the output labeled MATCH. Pin 54 of all of the tag RAMs forming a distributed tag RAM are connected together at the output MATCH.

Figure 6:
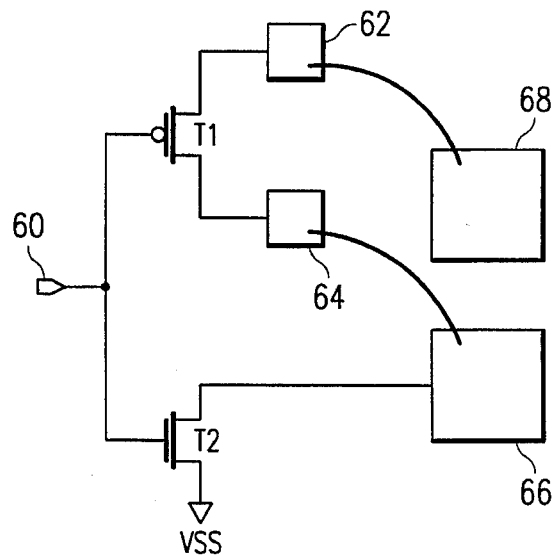
FIG. 6 illustrate a portion of a NOR gate in a tag RAM.

Often times, only two tag RAMs are required to provide sufficient address space. The approach shown in FIG. 5B may be implemented in a system requiring only two tag RAMs. Another configuration shown in FIGS. 6, 7, and 8 also may be used to connect two tag RAMs together. Referring to FIG. 6, a portion of a NOR gate in a tag RAM is illustrated. Point 60 is connected to a comparator in the tag RAM. Transistors T1 and T2 have gates controlled by the output from the comparator connected to point 60. Transistor T1 is a p-channel FET, while transistor T2 is an n-channel FET. The source/drain of transistor T2 is connected to internal pad 62 and a second source/drain of transistor T2 also is connected to an internal pad 64. Transistor T2 has a first source/drain connected to output pin 66 and a second source/drain connected to power supply voltage VSS. Additional pin 68 is connected to internal pad 62 using a bond or metal option. Similarly, internal pad 64 is connected to output pin 66 using a bond or metal option.

Figure 7:
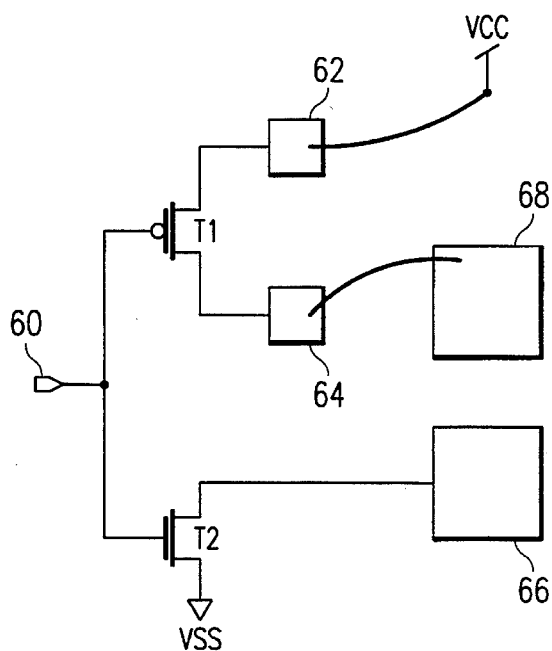
FIG. 7 illustrates a portion of a NOR gate in a tag RAM.

FIG. 7 illustrates a portion of a NOR gate in a tag RAM. Internal pad 62 is connected to power supply VCC using a bond or metal option; internal pad 64 is connected to additional pin 68 also using a bond or metal option. A source/drain of transistor T2 is connected to output pin 66 while a second source/drain of transistor T2 is connected to power supply VSS.

Figure 8:
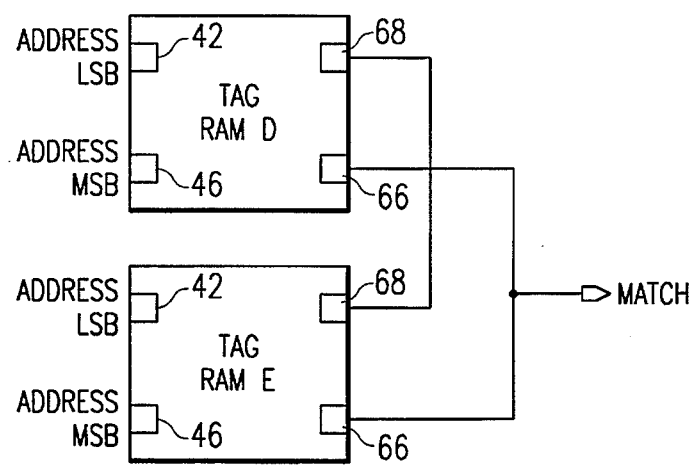
FIG. 8 is a block diagram of a distributed tag RAM configuration employing the two tag RAMs illustrated in FIG. 6 and 7 connected together according to the present invention.

Referring now to FIG. 8, a block diagram of two tag RAMs connected together according to the present invention is illustrated. Additional pin 68 on tag RAM D, which corresponds to FIG. 6, is connected to corresponding additional pin 68 on tag RAM E, which corresponds to FIG. 7. Similarly, on tag RAM D, output pin 66 is connected to tag RAM E's output pin 66. These two pins are connected to an output, MATCH. The resulting configuration is a full CMOS NOR replacing the traditional wired-NOR. The advantage of this configuration is that only one extra pin is required. For a single chip tag RAM, the FIG. 6 tag RAM may be used with pin 68 connected to power supply voltage VCC.

Using a preferred embodiment of the present invention, expanded address space may be provided in a tag RAM. In the depicted embodiments, the tag RAMs are not hooked together to provide more address entries, but to make each address entry wider. However, the tag RAMs may be configured to provide more address entries, in accordance with a preferred embodiment of the present invention. In other words, larger addresses may be processed using a preferred embodiment of the present invention. For example, two 11 bit-wide tag RAMs may be combined using the present invention to provide a distributed tag RAM that is 22 bits wide. The distributed tag RAM could process 32 bit address, using 22 bits for the MSBs and using 10 LSBs to index the distributed tag RAM. Additionally, the present invention allows the construction of larger tag RAMs, using presently available tag RAMs with minor modifications compared to designing and fabricating on entirely new tag RAM. The present invention provides a CMOS NOR gate function, wherein part of the gate is located in each chip. In addition, a distributed NAND gate may be produced using the present invention by connecting the n-channel FETs in the tag RAMs in series and connecting the p-channel FETs in the tag RAMs to VCC and the output. Basically, the p and n-channel connections are swapped to form a distributed NAND gate.

While the invention has been particularly shown and described with reference to a preferred embodiment, it will be understood by those skilled in the art that various changes in form and detail may be made therein without departing from the spirit and scope of the invention.

What is claimed is:
1. A tag RAM comprising:
a first input for receiving a first portion of an address;
a second input for receiving data;
a first pin;
a second pin;
an output pin;
a memory array connected to the first and second inputs;
a comparator connected to the memory array and the second input, wherein the comparator has an output that produces an output signal in response to receiving a first signal from the second input and a second signal from the memory array;
a first transistor having a gate connected to the comparator output, a first source/drain connected to the first pin, and a second source/drain connected to the second pin; and
a second transistor having a gate connected to the comparator output, a first source/drain connected to the output pin, and a second source/drain connected to a lower power supply voltage source.

2. The tag RAM of claim 1, wherein the first transistor is a p-channel field effect device.

3. The tag RAM of claim 1, wherein the second transistor is an n-channel field effect device.

4. A distributed tag RAM comprising:
a match pin;
a first tag RAM including:
a first pin;
a second pin;
a first output pin;
a first comparator with an output;
a first transistor having a gate connected to the output of the first comparator, a first source/drain connected to a first pin, and a second source/drain connected to a second pin; and
a second transistor having a gate connected to the output of the first comparator, a first source/drain connected to the first output pin, a second source/drain connected to a lower power supply voltage source.
a second tag RAM including:
a third pin;
a fourth pin;
a second output pin;
a second comparator with an output;
a first transistor having a gate connected to the output of the second comparator, a first source/drain connected to a third pin, and a second source/drain connected to a fourth pin; and
a second transistor having a gate connected to the output of the second comparator, a first source/drain connected to the second output pin, a second source/drain connected to a lower power supply voltage source; and
the first pin being connected to an upper power supply voltage;
the second pin being connected to the third pin;
the first output pin being connected to the match bus; and
the fourth pin and the second output pin being connected to the match bus, wherein a NOR configuration is formed by the first and second tag RAMs.

5. The distributed tag RAM of claim 1, wherein the first transistor is a p-channel field effect device.

6. The distributed tag RAM of claim 1, wherein the second transistor is an n-channel field effect device.

7. A distributed tag RAM comprising:
   a match bus;
   plurality of tag RAMs including at least a first and a last tag RAM, each tag RAM having:
      a first pin;
      a second pin;
      an output pin;
      a memory array connected to the first input;
      a comparator connected to the memory array and the second input, wherein the comparator has an output that produces an output signal in response to receiving a first signal from the second input and a second signal from the memory array;
      a first transistor having a gate connected to the output of the comparator, a first source/drain connected to the first pin, and a second source/drain connected to the second pin; and
      a second transistor having a gate connected to the output of the comparator, a first source/drain connected to the output pin, and a second source/drain connected to a lower power supply voltage source; and
   the first pin of the first tag RAM being connected an upper power supply voltage;
   the second pin of each tag RAM, other than the last tag RAM, being connected to the first pin of a subsequent tag RAM;
   the output pin of each tag RAM being connected to the match bus; and
   the second pin of the last tag RAM being connected to the match bus, wherein a NOR function is provided between output pins of the tag RAMs.

8. The distributed tag RAM of claim 7, wherein the first transistor is a p-channel FET.

9. The distributed tag RAM of claim 7, wherein the second tag RAM is a n-channel FET.

10. A tag ram comprising:
    a first input for receiving a first portion of an address;
    a second input for receiving data;
    an additional pin;
    an output pin;
    a memory array connected to the first and second inputs;
    a comparator connected to the memory array and the second input, wherein the comparator has an output that produces an output signal in response to receiving a first signal from the second input and a second signal from the memory array;
    a first transistor having a gate connected to the output of the comparator, a first source/drain connected to the additional pin, and a second source/drain connected to the output pin; and
    a second transistor having a gate connected to the output of the comparator, a first source/drain connected to the output pin, and a second source/drain connected to a lower power supply voltage source.

11. The tag RAM of claim 10, wherein the first transistor is a p-channel field effect device.

12. The tag RAM of claim 10, wherein the second transistor is an n-channel field effect device.

13. A tag ram comprising:
    a first input for receiving a first portion of an address;
    a second input for receiving data;
    an additional pin;
    an output pin;
    a memory array connected to the first and second inputs;
    a comparator connected to the memory array and the second input, wherein the comparator has an output that produces an output signal in response to receiving a first signal from the second input and a second signal from the memory array;
    a first transistor having a gate connected to the output of the comparator, a first source/drain connected to an upper power supply voltage and a second source/drain connected to the additional pin; and
    a second transistor having a gate connected to the output of the comparator, a first source/drain connected to the output pin, and a second source/drain connected to a lower power supply voltage source.

14. The tag RAM of claim 13, wherein the first transistor is a p-channel field effect device.

15. The tag RAM of claim 13, wherein the second transistor is an n-channel field effect device.

16. A distributed tag RAM comprising:
    a match pin;
    a first tag ram including:
       an additional pin;
       a first output pin;
       a first comparator having an output;
       a first transistor having a gate connected to the output of the first comparator, a first source/drain connected to the additional pin, and a second source/drain connected to the first output pin; and
       a second transistor having a gate connected to the output of the first comparator, a first source/drain connected to the first output pin, and a second source/drain connected to a lower power supply voltage source;
    a second tag ram including:
       a second additional pin;
       a second output pin;
       a second comparator having an output;
       a first transistor having a gate connected to the output of the second comparator, a first source/drain connected to an upper power supply voltage and a second source/drain connected to the second additional pin; and
       a second transistor having a gate connected to the output of the second comparator, a first source/drain connected to the second output pin, a second source/drain connected to a lower power supply voltage source;
    the additional pin of the first tag RAM and the second additional pin of the second tag RAM being connected to each other; and
    the output pin of the first tag RAM and the second output pin of the second tag RAM being connected to the match bus.

17. The distributed tag RAM of claim 16, wherein the first transistor is a p-channel field effect device.

18. The distributed tag RAM of claim 16, wherein the second transistor is an n-channel field effect device.

19. A device with an output signal to be combined with similar signals from other devices, the device comprising:
    an output;
    a first pin for connection off of the device;
    a second pin for connection off of the device;
    an output pin for connection off of the device;

a first transistor having a gate connected to the output, a first source/drain connected to the first pin, and a second source drain connected to the second pin; and a second transistor having a gate connected to the output, a first source/drain connected to the output pin, and a second source drain connected to a power supply voltage;

wherein the output receives a signal representative of a tag RAM match.

20. A distributed function device comprising:

a primary output;

a plurality of devices including at least a first and a last device, each device comprising:

an output;
an output pin;
a first pin;
a second pin;
a first transistor having a gate connected to the output, a first source/drain connected to the first pin, a second source drain connected to the second pin; and
a second transistor having a gate connected to the output, a first source/drain connected to the output pin, a second source drain connected to a first power supply voltage; and the first pin of the first device being connected to a second power supply voltage;

the second pin of each device, other than the last device, being connected to the first pin of a subsequent device;

the output pin of each device being connected to the primary output; and the second pin of the last device being connected to the primary output.

21. The distributed function device of claim 20, wherein the first power supply voltage is an upper power supply voltage, the second power supply voltage is a lower power supply voltage, the first transistor in each device is a n-channel device, and the second transistor in each device is a p-channel device, wherein a distributed NAND function is provided.

22. The distributed function device of claim 20, wherein the first power supply voltage is a lower power supply voltage, the second power supply voltage is an upper power supply voltage, the first transistor in each device is a p-channel device, and the second transistor in each device is a n-channel device, wherein a distributed NOR function is provided.

23. The device of claim 19, wherein the output signal is combined with similar signals from other devices.

* * * * *